United States Patent [19]
Caire et al.

[11] Patent Number: 5,487,075
[45] Date of Patent: Jan. 23, 1996

[54] HIGH-SPEED STAGED DECODER/QUANTIZER

[75] Inventors: Guiseppe Caire, Turin, Italy; Javier Ventura Traveset, Leiden; Martin Hollreiser, Den Haag, both of Netherlands; Ezio Biglieri, Turin, Italy

[73] Assignee: Agence Spatiale Europeenne, Paris, France

[21] Appl. No.: 246,516

[22] Filed: May 20, 1994

[51] Int. Cl.$^6$ .......................... G06F 11/10; H03M 13/00
[52] U.S. Cl. .......................... 371/37.1; 371/43; 341/200
[58] Field of Search .......................... 371/37.1, 43–46, 371/37.4; 375/17, 20, 94; 341/200

[56] References Cited

U.S. PATENT DOCUMENTS

5,329,536  7/1994  Darmon et al. .......................... 371/43

FOREIGN PATENT DOCUMENTS

0158830  6/1989  Japan.

OTHER PUBLICATIONS

G. David Forney, Jr., "The Dynamics of Group Codes: State Spaces, Trellis Diagrams and Canonical Encoder" IEEE Transactions on Information Theory, vol. 39, No. 9, Sep. 1993.

G. Fettweis, H. Meyr, "High–Rate Viterbi Processor: a Systolic Array Solution", IEEE Journal on Selected Areas in Communications, vol. 8, No. 8, Oct. 1990.

E. Biglieri, A Spalvieri: Generalized Concatenation: A Tutorial, Elsevier, 1992.

G. Claire, J. Ventura, J. Murphy, S. Y. Kung, "VLSI Systolic Array Implementation of a Staged Decoder for BCM Signals", Proceedings of the IEEE workshop on VLSI signal processing, Napa, Calif., USA, Oct. 28–30, 1992.

E. Biglieri, "Parallel Demodulation of Multi–dimensional Signals", IEEE Trans. on Commun., vol. 40, No. 10, Oct. 1992.

*Primary Examiner*—Paul P. Gordon
*Attorney, Agent, or Firm*—Henderson & Sturm

[57] ABSTRACT

A symbol-level pipelined structure for parallel systolic decoding of block codes which is a layered processor structure including a number of layers equal to the code length and each layer is adapted to decode the component codes of a concatenated code in sequence. The structure described provides efficient high rate decoding operation with an associated low cost and low hardware complexity.

9 Claims, 5 Drawing Sheets

HIGH-SPEED STAGED DECODER/QUANTIZER

FIELD OF THE INVENTION

The present invention relates generally to the implementation of high-speed staged decoders/quantizers, and more particularly to a systolic architecture for the VSLI implementation of high-speed staged decoders/quantizers.

BACKGROUND OF THE INVENTION

In many communication systems, the information signals are required to be transmitted at a very-high rate. Among other factors, one of the main limitations for the maximum achievable rate of signal transmission is the hardware feasibility of the decoder. in tact, very high-rate decoders are often very complex and expensive. Thus, there is a need for efficient low cost decoder implementations.

In modern digital communications the requirement of massive computation for high-speed signal processing at low cost can be accomplished by using VLSI special-purpose computers, whose architecture is determined by the algorithm to be implemented. A good architecture should also provide a linear-scale solution, i.e. a solution where the hardware complexity grows linearly with the throughput requirement.

When very high speed signal processing is to be dealt with, the choice of the algorithms is of crucial importance. Suitable algorithms have a high degree of parallelism and pipeline ability. Moreover, block-oriented algorithms naturally provide a linear-scale solution.

For VLSI implementation of parallel and pipelined algorithms, systolic array processors have been proposed. The two key parameters which define the processing speed of a systolic array are its block pipelining period $\beta$ and is clock period $t_c$. The former is defined as the number of time units between the beginning of two subsequent computation tasks. The latter is the basic time unit of the systolic array and it depends on the maximum propagation delay through a chain of gates in the processor. Clearly $t_c$ depends also on the single gate delay: when different VLSI technologies are considered (for example $2\mu$ CMOS, $1\mu$ CMOS, etc.) $t_c$ turns out to be scaled by a factor depending on the technology.

The systolic implementation of a block-oriented algorithm is known as Staged Decoding. This is a suboptimal general procedure for decoding a class of signal space codes and lattices obtained through generalized concatenation construction (E. Biglieri, A. Spalvieri: Generalised Concatenation: A Tutorial, In E. Biglieri and M. Luise eds: Coded Modulation and Bandwidth-Efficient Transmission, Elsevier, 1992).

This procedure has already been applied to the implementation of a staged decoder for BCM (Block Coded Modulation) signals (G. Caire, J. Ventura, J. Murphy, S. Y. Kung, "VLSI Systolic Array Implementation of a Staged Decoder for BCM Signals", Proceedings of the IEEE Workshop on VLSI signal processing, Napa Calif., USA, Oct. 28–30, 1992).

This known implementation method applied to block coded modulation (BCM) schemes relies on block-level pipelining. Thus, the winner codes are basically selected by computing the decoding metric for each possible legal codeword in the code family at each stage of the decoder. This implies that the maximum achievable rate is basically limited by the size of the larger code in the code structure and therefore decoders of complex code structures are fundamentally very slow. Specifically, a maximum rate of 100 Mbps has been reported with an associated hardware complexity of 38 Kgates.

SUMMARY OF THE INVENTION

It is an object of this invention to provide a low cost structure for high-speed staged decoders/quantizers with a lower associated hardware complexity.

Another object of the invention is to provide a symbol-level pipelined architecture for very efficient high-speed staged decoders/quantizers.

Yet another object of the invention is to provide a low cost and simplified layered structure for VLSI high-speed staged decoders/quantizers.

A further object of this invention is to provide a systolic array architecture for the parallel decoding of block codes.

Still another object of the invention is to provide an improved method for the low cost implementation of high-speed staged decoders/quantizers having a low hardware complexity.

Specifically, there is provided a very efficient symbol-level pipelined architecture for staged decoders/quantizers. In operation, an L-stage concatenated code is decoded by decoding its component codes in sequence by a staged processor and a final symbol-by-symbol decision is required when an uncoded stage is reached.

The efficiency of the structure according to the invention, in terms of area-speed, has been demonstrated in an exemplary implementation. Using a 1 $\mu$m CMOS technology, a BCM staged decoder has been designed with an effective decoding rate of more than 700 Mbps with a hardware complexity of less than 30 Kgates. Further, owing to the use of a trellis representation of the block codes, the invention reduces significantly the number of delay cells in the First In First Out memories.

The objects and advantages of the invention will be best understood from the following description when considered in conjunction with the accompanying drawings.

DETAILED DESCRIPTION OF THE INVENTION

Figure 1:
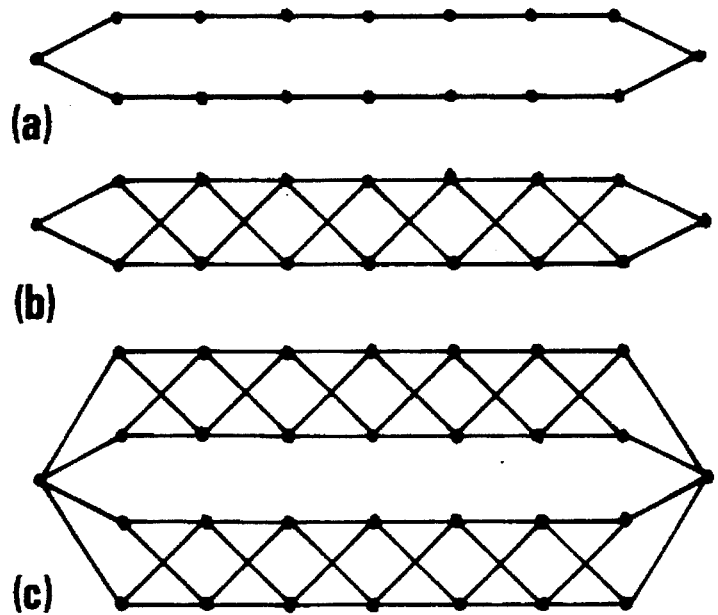
FIG. 1 shows the trellises for the (8,1,8),(8,7,2) binary codes and their Cartesian product.

The structure according to the invention is a layered structure for the parallel systolic decoding of block codes. Generally stated, the layered structure of the invention is based on staged decoding which is a procedure allowing the computational complexity of the decoding operation to be reduced.

In accordance with this invention, staged decoding is applied to concatenated codes C. The construction of concatenated codes is known per se (see E. Biglieri and A. Spalvieri mentioned earlier herein and which is incorporated herein by reference).

Briefly stated, consider L codes $C_0, C_1, \ldots, C_{L-1}$, which will be referred to as the component codes, with the same block length n and such that the alphabet of each code $C_L$ is the set of the integers $\{0,1,\ldots, M_l-1\}$. The L-tuple of code-words $(c_1, \ldots, c_{L-1})$ (where $c_L \epsilon C_L$) defines a sequence $S_{co,c,\ldots cL-1}$ of subsets of the L-th partition level. The concatenated code C is the set of all the sequences s of elements of S belonging to a sequence of subsets defined as above.

Let d denote a distance metric defined on S satisfying the additive property (the distance between sequences $s,s' \epsilon S^n$ is $d(s,s')=\Sigma_{k=1}^n d(s_k, s'_k)$ where $s_k$ and $s'_k$ are respectively the k-th elements of the sequences s and s'). Let $\Delta_o = \min\{d(s,s'): s,s' \epsilon S\}$ and $\Delta_l = \min\{d(s,s'): s,s' \epsilon S_{i1,i2,\ldots,il}\}$ for $l=1,2,\ldots,L$ (we assume that the minimum distance between elements of the same subset at stage l depends only on l and not on the particular subset). If we denote by $d_n(C)$ the minimum Hamming distance of C the minimum distance between codewords of C, with respect to the distance metric d, satisfies the following inequality:

$$d(C) \geq = \min\{d_n(C_o)\Delta_{o1} d_n(C_{L-1})\Delta_{L-1}, \Delta_L\} \quad (1)$$

The concatenated code C has the same structure as the code obtained by the Cartesian product $C_o \times C_1 \times C_{L-1}$. In particular, if each $C_l$ is represented by a trellis diagram (of finite or infinite length), the trellis diagram of C is given by the Cartesian product of the trellises of all the component codes.

If S is a signal set (a finite set of points in the real space $R^N$) of size $|S|=2^L$, d(.) denotes squared Euclidean distance (SED) and the codes $C_0, C_1, \ldots, C_{L-1}$ are $L \leq L'$ binary block codes with the same length $n_1$ the GC construction defines a signal space code $C \subset R^{nN}$. Codes obtained in this way are known as Block-Coded Modulation (BCM).

For instance, let us consider a two coded stage 8-PSK BCM code where $C_0$ and $C_1$ are the repetition code (8,1,8) and the single parity check code (8,7,2), respectively. A trellis representation for these codes is given in FIG. 1a) and b) and the trellis for the resulting code is given in FIG. 1c). Because of the uncoded stage, the trellis has two parallel transitions for each branch. This code has a block length n= 8 and a rate r= (1+7+8)/16=1 bit per dimension. From Eq. 1 it results that the minimum SED of this code is $\min\{8\Delta_0, 2\Delta_1, \Delta_2\}=4$, and therefore its asymptotic coding gain over uncoded 4-PSK (which yields the same value of r) is 3 dB.

A real n-dimensional lattice $\Lambda$ is a binary lattice when it is an integer lattice and it has $2^m Z^n$ as a sublattice, for some m. In particular, if m= 1 we will say that $\Lambda$ is a mod-2 binary lattice, if m= 2 we will say that $\Lambda$ is a mod-4 binary lattice. Mod-4 decomposable binary lattices have get the code formula $\Lambda = 4Z^n + 2C_1 + C_0$ which corresponds to a two-stage GC construction. Those lattices have a trellis representation which follows immediately from the Cartesian product trellis of the component binary codes. For example, a version of the Gosset lattice $E_8$ has the decomposition $RE_8=4Z^8+2(8,7,2)+(8,1,8)$, therefore its trellis structure is identical to the one of FIG. 1c).

Stage Decoding

When a code C is constructed via GC, a suboptimal general procedure known as Staged Decoding is used in order to reduce the computational complexity of the decoding operation. The idea underlying Staged Decoding is the following. An L-stage concatenated code C is decoded by decoding its component codes $C_0, C_1, \ldots, C_{L-1}$ in sequence. A final symbol-by-symbol decision is required when an Uncoded stage is reached. Any processor which implements Staged Decoding will be referred to as staged processor (SP).

Figure 2:
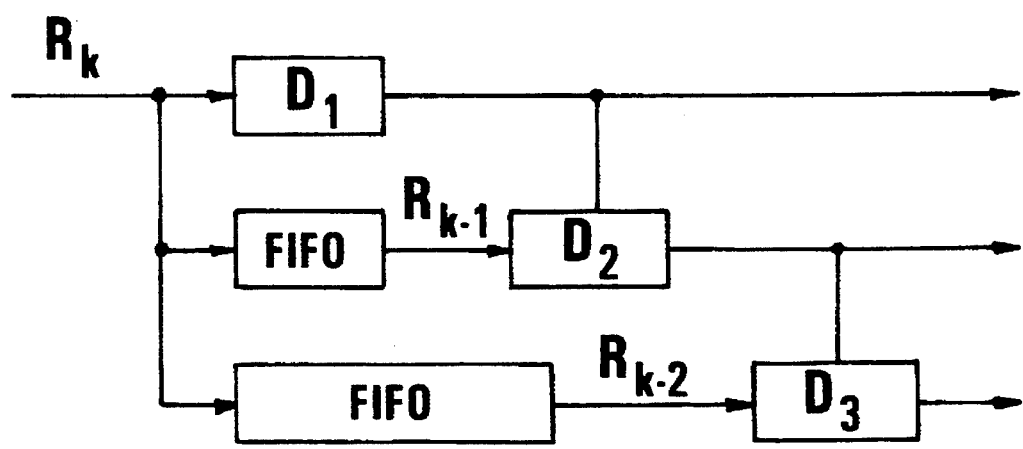
FIG. 2 is a block diagram of a three-stage Staged processor.

The general block diagram of a three-stage SP is shown in FIG. 2. Suppose an input data block R has to be decoded (or quantized) and consider, for example, a three-stage case. The decoder at the first stage produces an estimate of $\hat{c}_0 \epsilon C_0$ for all the possible choices of $\hat{c}_2$. The decoded codeword $\hat{c}_0$ identifies a sequence of subsets $S_{\hat{c}}0$. This information is passed to the next stage. The decoder at the second stage produces an estimate of $\hat{c}_1 \epsilon C_1$ by assuming that the choice of $\hat{c}_0$ was correct, i.e. by restricting its search to sequences in $S_{\hat{c}}0$. Finally, the decoder at the third stage produces an estimate of $\hat{c}_2 \epsilon C_2$ by assuming that the choices of $\hat{c}_0$ and $\hat{c}_1$ were correct, i.e. by restricting its search to sequences in $S_{\hat{c}}0.\hat{c}1$.

Since the decoder at stage 1 uses side information from decisions at the previous stages, the number of distances to be computed at each stage is greatly reduced with respect to an exhaustive computation. From the trellis complexity point of view, the SP is able to process the trellises relative to the component codes separately, instead of considering the Cartesian-product trellis of C. Moreover, as far as fast VLSI implementations are concerned, it is worthwhile noting that staged decoding is a naturally pipelined algorithm. Referring to FIG. 2, while decoder $D_2$ is decoding a block received at a time k, decoder $D_1$ is free to work on the next block received at time k+1, and decoder $D_3$ is still decoding the previous block received at time k−1.

Symbol-level Pipelined Architecture for the SP

In accordance with this invention there is provided a symbol-level pipelined SP architecture. Heretofore block-level pipelined architectures have been used for the SP (E. Biglieri, "Parallel Demodulation of Multidimensional Signals" IEEE Trans on Commun., Vol 40, No 10 Oct 1992 and G. Caire, J. Ventura, J. Murphy, S. Y. Kung, "VLSI Systolic Array Implementation of a 0 Staged Decoder for BCM Signals" Proceedings of the IEEE Workshop on VLSI signal processing, Napa Calif., USA, Oct 28–30, 1992).

Figure 3:
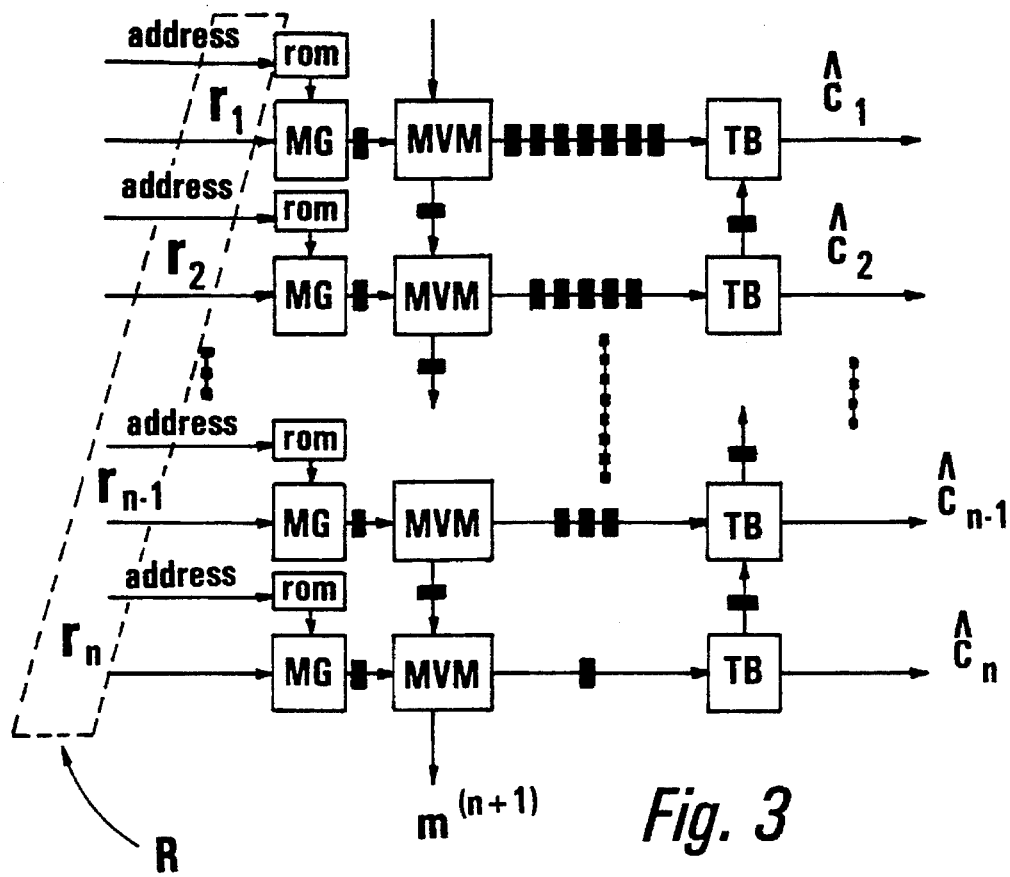
FIG. 3 shows a block diagram of an array for the systolic decoding of a finite-length trellis.

However, the invention exploits the trellis representation of block codes and the algebraic formulation of the Viterbi algorithm given in G. Fettweis, H. Meyr, "High-Rate Viterbi Processor: a Systolic Array Solution" IEEE Journal on Selected Areas in Communications, Vol. 8, No. 8, Oct. 1990 in order to derive a symbol-level pipelined SP architecture which is much more promising in terms of both efficiency and processing rate. FIG. 3 shows a block diagram of a layered structure for parallel systolic decoding of block codes. Since the delays (black boxes) between MVM and TB PEs form a "V"-shaped buffer, this structure will be referred to as V. Each layer of the V corresponds to a step in the trellis, so that n layers are implemented for a code of length n. Each k-th layer includes a metric generator (MG) which provides the branch metrics arranged as elements of the matrix $D^{(k)}$, a matrix-vector multiplier (MVM) which can be implemented in the form of MVM1 or MVM2 and a trace-back device (TB).

Block codes are represented on a finite-length trellis diagram. If a code C is linear, then a minimal encoder and a minimal trellis diagram for C is well-defined and it can be obtained through a purely algebraic standard procedure. All the details of the derivation of the minimal trellis representation for any linear code can be found in G. D. Forney, Jr., "The Dynamics of Group Codes: State Spaces, Trellis Diagrams and Canonical Encoders", Submitted to IEEE Trans. Inform. Theory, February 1992. Trellis representations for the single parity check code and for the repetition code are shown in FIG. 1.

For each symbol $r_i$ in a data block R the MG at layer k has to compute the matrix of the branch metrics in the k-th trellis section. For example, if we deal with a binary code, MG computes the two values d(0) and d(1) corresponding to branches labeled by "0" and "1" and arranges them as entries of $D^{(k)}$ according to the connections of its trellis section.

Figure 4:
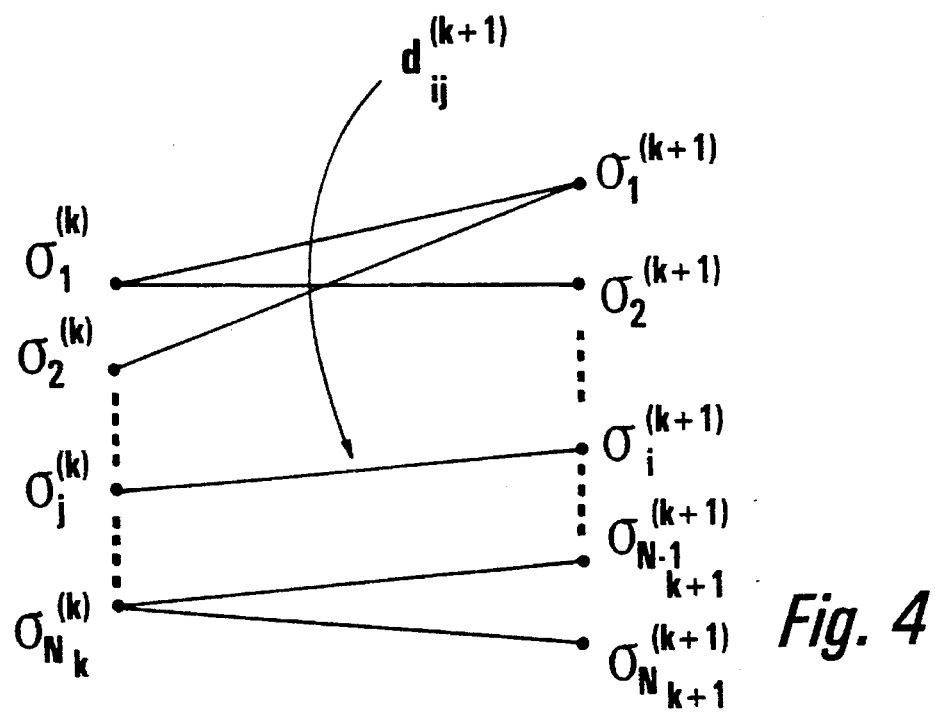
FIG. 4 shows one section of a trellis.

Consider the trellis section of FIG. 4. We have $N_k$ states $\sigma_1^{(k)}, \sigma_2^{(k)}, \ldots, \sigma_{Nk}^{(k)}$ at step k and $N_{k+1}$ states $\sigma_1^{(k+1)}, \sigma_2^{(k+1)}, \ldots, \sigma_{Nk+1}^{(k+1)}$, at step k+1. With each pair of states $\sigma_j^{(k)}$ and $\sigma_i^{(k+1)}$ are associated the path metrics $m_j^{(k)}$ and $m_i^{(k+1)}$ which are the metrics corresponding to the surviving paths terminating in states $\sigma_j^{(k)}$ and $\sigma_i^{(k+1)}$, respectively. For each branch from state $\sigma_j^{(k)}$ to state $\sigma_i^{(k+1)}$ there is a branch metric $d_{ij}^{(k)}$ which is the contribution of that branch to the path metrics at step k+1.

Define the two operations $a \oplus b = \max(a,b)$ and $a \otimes b = a+b$ The distributive law holds for $\oplus$ over $\otimes$, moreover we can define a "zero" element q such that $a \oplus q = a$ and $a \otimes q = q$ Define the vector of the path metrics at step k and k+1 respectively as $m^{(k)} = (m_1^{(k)}, m_2^{(k)}, \ldots, m_{Nk}^{(k)})^T$ and $m^{(k+1)} = (m_1^{(k+1)}, m_2^{(k+1)}, \ldots, m_{Nk+1}^{(k+1)})^T$ and define the transition matrix $D^{(k)} = [d_{ij}^{(k)}]$ where $d_{ij}^{(k)} = q$ if there is no branch from $\sigma_j^{(k)}$ to $\sigma_i^{(k+1)}$. Then the metric updating can be expressed in the form of a matrix-vector product: $m^{(k+1)} = D^{(k)} m^{(k)}$ where $\oplus$ and $\otimes$ are used instead of the usual addition and multiplication.

Figure 5:
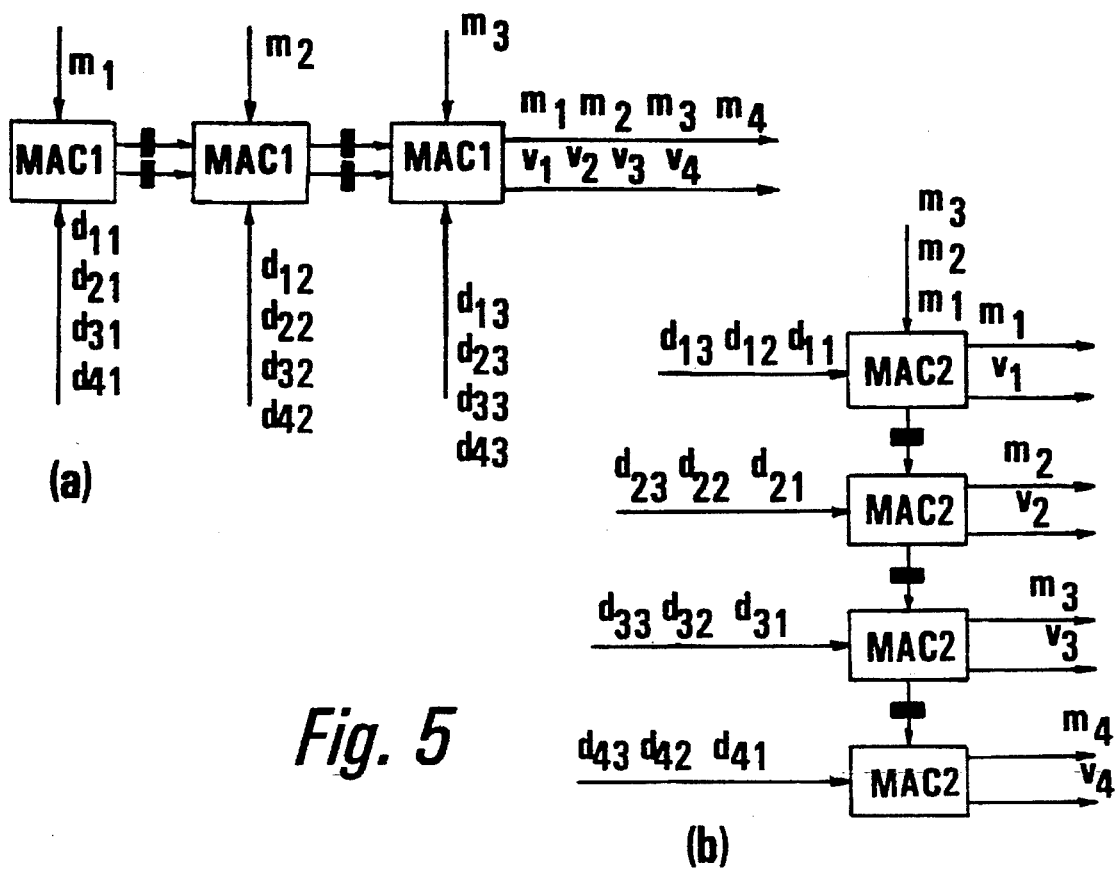
FIG. 5 represents matrix-vector multipliers for MVM1 and MVM2.

FIG. 5 shows two word level systolic arrays which implement matrix-vector product. The block pipelining period of the first scheme (MVM1) is $\beta_{MVM} = N_{k+1}$. The block pipelining period of the second scheme (MVM2) is $\beta_{MVM} = N_k$. The PEs of MVM1 and MVM2 are respectively denoted by MAC1 and MAC2, they are different but they have almost the same complexity.

Both arrays provide an additional output vector $v^{(k)}$ with $N_{k+1}$ components which stores the winning states at step k for each surviving path terminating at step k+1. In this way $v^{(k)}$ is a vector of pointers from each state at step k+1 to their winner at step k.

Metric updating is performed downward. The path metric comes from the (k−1)-th layer down to the k-th layer where it is updated by the MVM and it is passed down to the (k+1)-th layer. At layer n all the paths merge into the final state of the trellis and the winning path is selected. The winner path's metric $m^{(n+1)}$ is output from the bottom of the V and it can be used as a quality measure of the selected codeword. Then the decision is propagated upward through the chain of TBs which produce the symbols of the selected codeword. Dealys elements provide the necessary skew of the v vectores which have to be processed by the TBs. The data blocks R are fed in a parallel skewed way, as shown in FIG. 3.

An L-stage SP can be obtained by stacking L such V arrays. Note that a finite-length trellis can be decoded in both directions so that wa can connect the stages alternatively upside down in a "AVA . . . " structure which does not need any additional buffer between stages. All the V stages perform metric updating downward and trace-back upward, all the A stages perform metric updating upward and trace-back downward.

Figure 6:
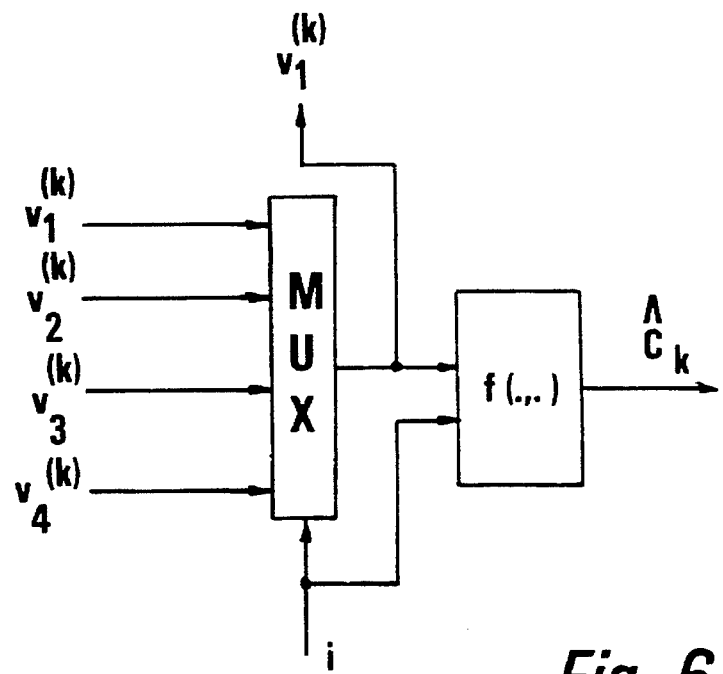
FIG. 6 shows the block diagram of a trace-back processing element.

At step n+1 of the trellis all the paths merge into a final state. Therefore the path which has accumulated the best path metric is selected as the winner. In order to decode the codeword ĉ which corresponds to the winner path we have to trace-back (TB) the trellis. Consider the single step TB procedure. Suppose the winner path passes through the state $\sigma_i^{(k+1)}$. Then the winner path will pass also through the state $\sigma_{v(i)}^{(k)}$. Moreover, since the output symbols are uniquely determined by the transition with which they are associated, it is possible to obtain the k-th symbol of ĉ as well-defined function $f_k$ of the couple of the index pair $i, v_i^{(k)}$. FIG. 6 shows the block diagram of a TB device which implements the general trace-back operation.

The SP architecture according to the invention has been applied to the implementation of a Staged Decoder for the 8-PSK CM scheme of length n=8 and rate r=1. The design was done by using VHDL (VHSIC Hardware Description Language where VHSIC stands for Very High Speed Integrated Circuit) to obtain a technology independent highly flexible design description on a behaviour level. Critical parameters like the number of quantisation bits, the block length and the 8-PSK constellation points (word length and values) were defined in a special package to keep the design as flexible as possible.

For the implementation, the design logic synthesis with 1 μm drawn (0.8 μm length) Complementary Metal-Oxide Conductor technology was used. Attributes were Worst Case Commercial including estimated wire length.

Figure 7:
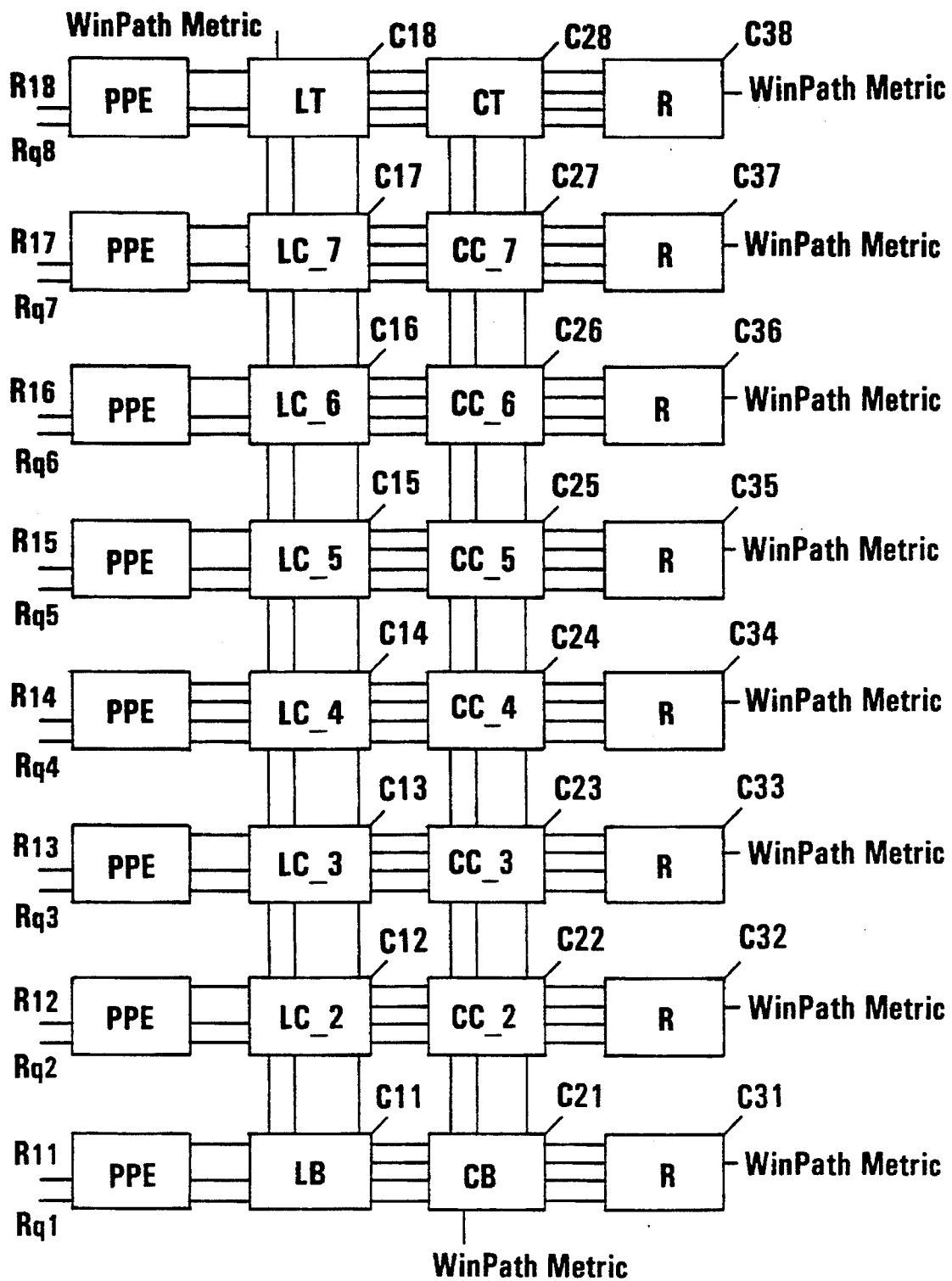
FIG. 7 shows the top level architecture of a staged decoder for a 8-PSK BCM scheme.

The top level architecture is shown in FIG. 7. The data are fed into the array in a skewed way (Ri1, Rq1 first) via a serial to parallel converter (not shown) which has to be implemented using Emitter Coupled Logic or Gallium Arsenide technology, as the required clock frequency is roughly 700 MHs.

The design mainly consists of eight different processing elements PEs. Their internal processing length is adjusted by using a generic. The elements are described as follows:

The PPE (Pre-Processing Element) extracts the PSK constellation quadrant where the received symbol lies in. This allows us to reduce to a large extent the computation effort of the MGs in the following stages. In fact, with the quadrant information together with the information of the previous stage decisions, it is possible to reduce to only two the number of signals to be considered in each subset at each stage.

The elements LT, LC__ and LB form the first stage and extract the repetition code. There are six instances of LC__ which only differ in the internal processing word length (defined by the generic).

The elements CT, CC__ and CB form the second stage and extract the parity check code. There are six instances of CC__ which only differ in the internal processing word length (defined by the generic).

The element R forms the third stage and extracts the non-redundant code. There are eight instances which are identical.

Figure 8:
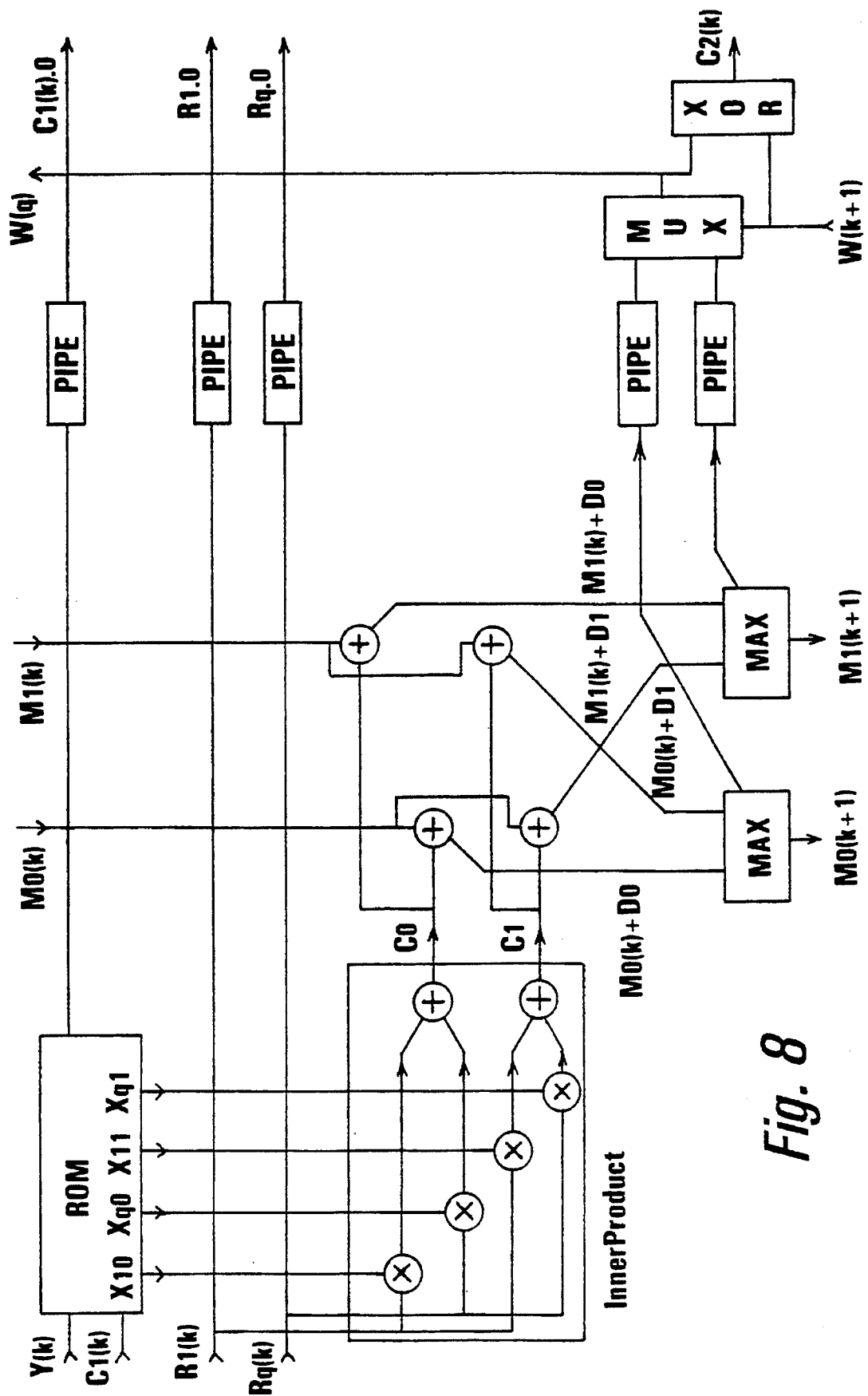
FIG. 8 is a functional block diagram of a typical processing element for implementing the invention.

Even though, according the general architecture of the invention, all the PEs have the same structure, ad hoc simplifications can be made in the first and third stages due to the fact that the repetition code and the non-redundant code are particularly simple. Also the top and bottom elements can be simplified due to the fact that they implement the first and the last steps of the trellis. Since the PE__C is the most general element, this will be described for general illustration hereafter with reference to FIG. 8. The figure shows the functional units, the actual implementation is different to achieve a fast and small design. From left to right it is easy to identify the MG, the MVM and the TB sub-blocks associated to the trellis-step of the associated block-code.

Speed efficiency and area reduction has been achieved basically by dramatically simplifying the MG sub-block, which is common to all the PEs in the circuit (except the PPE). Part of this simplification has been achieved by carefully selecting convenient values for the constellation points stored in the ROM, which simplified very much the multiplication operations. Further reduction has been achieved by implementing the ROM using random logic. Regular tables can be minimised and implemented in a very compact way together with the circuit for the inner product. The use of random logic, in addition, allows further pipelining to increase speed whereas a ROM cannot.

In the general circuit, a large amount of area is used by the delays. Three possible implementations for the delays have been considered: edge triggered flip-flops (five gates per delay), two phase clock (latch) (three gates per delay) and dynamic latches (1.5 gates per delay). Flip-flops result in the most complex implementation but simplifies the clock net. Dynamic latches, on the other hand, gives the smallest complexity implementation but in this case two non overlapping clock phases and their inverted signals have to be generated and routed across the chip.

Table 1 gives the final gate count for three different delay implementations.

TABLE 1

|  | flip-flop | latch | dynamic latch |
|---|---|---|---|
| gates | 25340 | 20621 | 17082 |

The circuit operates with a maximal clock frequency of 46 MHs. The block pipelining period of the array is $\beta=1$, so that its processing speed is R= 736 Mdimensions/second. Since the BCM scheme has a rate of 1 bit per dimension, we get a final decoding rate of 736 Mbps.

For testability it is intended to use CSTP (Circular Self Test Path) since certain experience with more complex and far more irregular designs already showed very good results.

The implementation example shows that, by heavily paralleling and by using some circuit tricks, very high bit rates can be achieved while maintaining quite a low number of gates. The a test technologies available are 0.6μm drawn (0.45μm effective channel length). Although it is not possible to give some performance number, some further improvements in speed can certainly be achieved. Furthermore, given the block-oriented nature of the Staged Decoding, faster solutions can be achieved by stacking several SPs.

We claim:

1. A decoder/quantizer comprising:
   at least one stack of layered processor structure having n layers, each of the layers of the layered processor structure comprising a metric generator for receiving a component code to determine a matrix of metrics corresponding to branches of a trellis section;
   a matrix-vector multiplier for receiving matrix data from the metric generator associated therewith and vector metrics for updating the matrix data;
   a trace-back processing element for receiving updated matrix data from the matrix-vector multiplier associated therewith to produce a respective symbol of a selected codeword,
   wherein each matrix-vector multiplier in the stack of layered processor structure updates the matrix data from the metric generator associated therewith in a same layer in response to the updated matrix data from the matrix-vector multiplier in a next lower layer, and
   wherein each trace-back processing element in the stack of layered processor structure updates the matrix data from the metric generator associated therewith in a same layer in response to the updated matrix data from the trace-back processing element in a next upper layer.

2. A decoder/quantizer as defined in claim 1, wherein each of the layers of the layered processor structure further comprises a pre-processing element for driving the metric generator.

3. A decoder/quantizer as defined in claim 1, comprising a plurality of stacks of layered processor structures and structure for buffering connected between any two of said plurality of stacks of layered processor structures to achieve an inverse skew of data that are to be propagated through each of the layers in each stack of layered processor structure.

4. The decoder/quantizer of claim 1, wherein said decoder/quantizer comprises structure for parallel decoding of block codes.

5. The decoder/quantizer of claim 1, wherein said decoder/quantizer structure comprises systolic array architecture for parallel decoding of block codes.

6. The decoder/quantizer of claim 4, wherein said block codes comprise block codes represented on a finite length trellis diagram comprising a number n of steps.

7. The decoder/quantizer of claim 1, wherein said decoder/quantizer structure comprises symbol-level pipelined architecture.

8. The decoder/quantizer of claim 1, wherein said decoder/quantizer comprises a very large scale integration high-speed staged decoder/quantizer.

9. The decoder/quantizer of claim 1, wherein said decoder/quantizer comprises structure for staged decoding of concatenated codes.

* * * * *